(12) United States Patent
Klingström

(10) Patent No.: US 9,324,704 B2
(45) Date of Patent: Apr. 26, 2016

(54) ELECTRONIC DEVICE, CIRCUIT AND METHOD FOR TRIMMING ELECTRONIC COMPONENTS

(71) Applicant: Telefonaktiebolaget L M Ericsson (publ), Stockholm (SE)

(72) Inventor: Leif Klingström, Lund (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 14/600,156

(22) Filed: Jan. 20, 2015

(65) Prior Publication Data

US 2015/0221635 A1      Aug. 6, 2015

(30) Foreign Application Priority Data

Feb. 4, 2014   (EP) ..................... 14153824

(51) Int. Cl.
| | |
|---|---|
| H03L 5/00 | (2006.01) |
| H01L 27/06 | (2006.01) |
| H01C 17/22 | (2006.01) |
| G01R 31/28 | (2006.01) |
| G01R 27/26 | (2006.01) |
| H01C 17/242 | (2006.01) |

(52) U.S. Cl.
CPC .............. *H01L 27/06* (2013.01); *G01R 31/282* (2013.01); *H01C 17/22* (2013.01); *G01R 27/26* (2013.01); *H01C 17/242* (2013.01)

(58) Field of Classification Search
CPC ....... G01R 31/282; H01C 17/22; H01L 27/06
See application file for complete search history.

(56) References Cited

U.S. PATENT DOCUMENTS

| | | | |
|---|---|---|---|
| 4,709,225 A | 11/1987 | Welland et al. | |
| 5,361,001 A | * 11/1994 | Stolfa ................. | H03K 17/693 327/312 |

(Continued)

FOREIGN PATENT DOCUMENTS

| | | |
|---|---|---|
| JP | 01-315175 | 12/1989 |
| WO | 2004/049401 A2 | 6/2004 |

OTHER PUBLICATIONS

European Search Report issued in corresponding European application No. EP 14 15 3824, date of completion of the search Jul. 30, 2014.

*Primary Examiner* — Jeffrey Zweizig
(74) *Attorney, Agent, or Firm* — Patent Portfolio Builders PLLC

(57) ABSTRACT

A circuit comprises a plurality of electronic components integrated on a substrate, and a trim arrangement arranged to provide trim data to a respective electronic component of the plurality of electronic components. The electronic components are programmable such that the electronic components are enabled to be assigned desired properties. The trim arrangement comprises a first trim data source providing a first trim data set represented by a first number of bits, and at least one second trim data source providing a second trim data set representing an offset from the first trim data set. The second trim data set is represented by a second number of bits. The second number is less than the first number. At least one of the plurality of electronic components is provided with a trim data set formed from the first and second trim data sets such that the at least one of the plurality of electronic components is enabled to adjust its properties based on the trim data set. An electronic device comprising such a circuit and a method of trimming at least two electronic components of a circuit comprising a plurality of electronic components integrated on a substrate and a trim arrangement are also disclosed.

15 Claims, 7 Drawing Sheets

(56) References Cited

U.S. PATENT DOCUMENTS

| | | | |
|---|---|---|---|
| 5,596,322 A | 1/1997 | Marsh et al. | |
| 9,000,351 B2 * | 4/2015 | Noda | H01H 37/761 250/214 DC |
| 2003/0178396 A1 | 9/2003 | Naumov et al. | |
| 2007/0290704 A1 | 12/2007 | Shyh et al. | |
| 2013/0134297 A1 | 5/2013 | Noda et al. | |

* cited by examiner

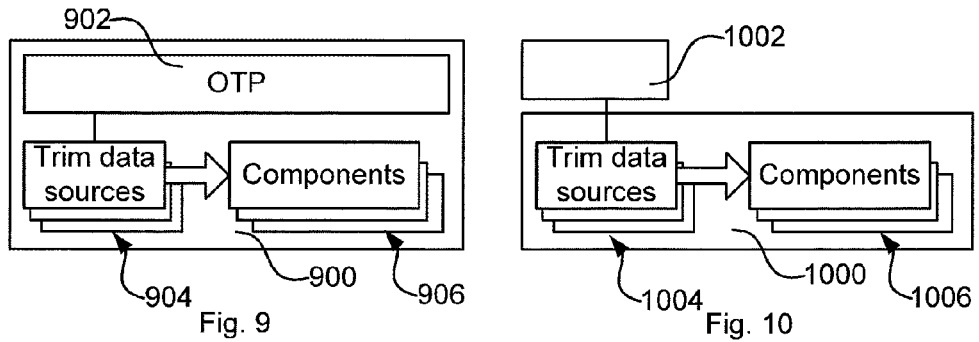
Fig. 9
Fig. 10
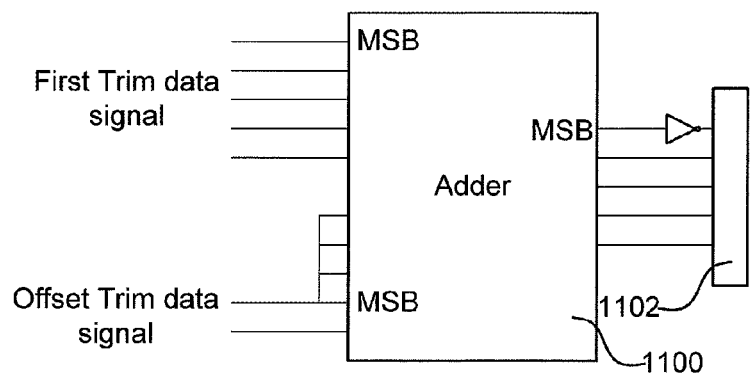
Fig. 11
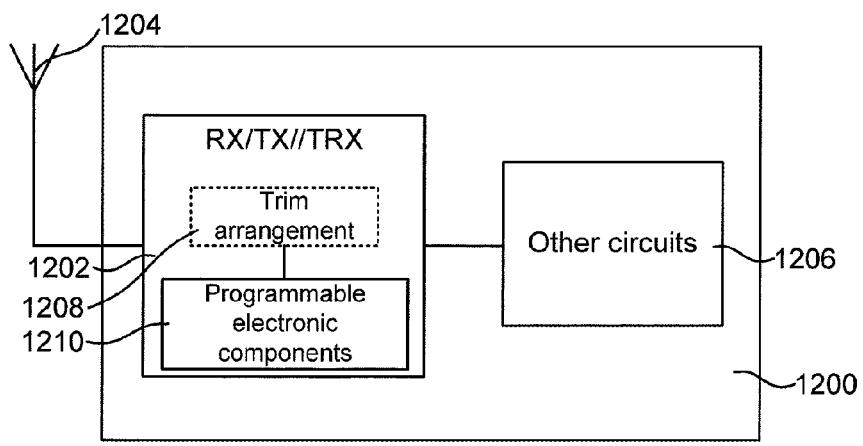
Fig. 12

ELECTRONIC DEVICE, CIRCUIT AND METHOD FOR TRIMMING ELECTRONIC COMPONENTS

TECHNICAL FIELD

The present invention generally relates to a circuit for integration on a substrate with a trim arrangement for programmable electronic components, a communication device utilising such circuit, and a method for trimming programmable electronic components.

BACKGROUND

Components like resistors, capacitors and transistors will never be exact when implemented on silicon chips, and there will be a variation around the desired component value. The matching between components of the same type may be quite good. This may be achieved when the components are of similar dimensions, oriented in the same direction and placed close to each other. Often, matching between components of the same type is more important than the exact values of the components. Sometimes, more exact component values are needed, which may require trimming. Also secondary properties, like voltage levels, currents, oscillator frequencies and filter bandwidths may sometimes require trimming. The components, voltages, currents etc. that need to be accurate may be designed to be programmable, which may be controlled by trim bits, i.e. a trim value represented by a number of bits which is provided to the programmable component. On-chip components may be made up of several smaller parts that are connected in series or parallel to provide the properties of the component. The trimming may be digitally controlled and the parts of the components may be switched in or out, depending on the value of the trim data set. The trimming may be done by software after boot and the trim settings may for example be stored in on-chip memory cells that may lose their information when supply power is lost. However, analog baseband or power management circuits in for example communication apparatuses may be intended to operate even before boot when no other circuits are operational and consequently, the trimming cannot in such situations be done by software. Instead, the trimming is done once during manufacturing of the circuits, and the trim settings may be stored in on-chip One Time Programmable (OTP) memory cells. These may typically be metal fuses, Electrically Erasable Programmable Read Only Memory (EEPROM) cells or something similar. Such memories often require a large silicon area and the memory capacity may therefore for practical reasons be limited. Consequently, trim bits may be considered as "expensive" and are normally only be used when really crucial. If all trimmed components, currents etc use their own set of trim bits, like illustrated in FIG. 1, a large amount of the "expensive" trim bits would be required. Alternatively, an approach may be to trim one component and then use the same trim settings also for similar components like illustrated in FIG. 2. This requires that the matching is good between the components and that the trimming ranges are proportional. If the components are more distant from each other, of different orientation or dimensions, then the matching will be worse but there will probably still be some correlation. This method will probably give some improvement even when the components are not well matched. However, the result may not be predictable enough for some designs. The design rules for matching between components normally require that the components are adjacent to each other and it is very hard to guarantee any specific matching if this requirement is not met.

There is a desire to improve trimming, and/or limit consumed circuit area for the trimming.

SUMMARY

An object of the invention is to at least alleviate the above stated problem. The present invention is based on the understanding that there is often a need for trimming of several components of similar type on a silicon chip, and the variation of these components may be correlated, depending on the design, vicinity and orientation of the components. The inventor has found that trimming dynamics, i.e. difference between components on a chip that need to be trimmed, is less than trimming dynamics that is needed for the different circuits, and has provided a solution where a trim data set with a larger dynamic, i.e. more bits, is provided and for the different components there are provided an offset trim data set with less dynamic, i.e. lesser bits, wherein the trim data set to respective component to be trimmed is enabled to provide accurate trimming and still a limited number of bits are needed to be stored.

According to a first aspect, there is provided a circuit comprising a plurality of electronic components integrated on a substrate, and a trim arrangement arranged to provide trim data to a respective electronic component of the plurality of electronic components. The electronic components are programmable such that the electronic components are enabled to be assigned desired properties. The trim arrangement comprises a first trim data source providing a first trim data set represented by a first number of bits, and at least one second trim data source providing a second trim data set representing an offset from the first trim data set. The second trim data set is represented by a second number of bits. The second number is less than the first number. At least one of the plurality of electronic components is provided with a trim data set formed from the first and second trim data sets such that the at least one of the plurality of electronic components is enabled to adjust its properties based on the trim data set.

At least one of the plurality of electronic components may be provided with a trim data set formed from only the first trim data set such that the at least one of the plurality of electronic components is enabled to adjust its properties based on the trim data set.

The trim arrangement may comprise at least one third trim data source providing a third trim data set representing an offset from the first trim data set. The third trim data set may be represented by a third number of bits. The third number may be less than the first number. At least one of the plurality of electronic components may be provided with a trim data set formed from the first and third trim data sets such that the at least one of the plurality of electronic components is enabled to adjust its properties based on the trim data set.

The trim arrangement may comprise at least one fourth trim data source providing a fourth trim data set representing an offset from the trim data set formed from the first and second trim data sets. The fourth trim data set may be represented by a fourth number of bits. The fourth number may be less than the first number such that at least one of the plurality of electronic components is provided with a trim data set formed from fourth trim data set and the trim data set formed from the first and second trim data sets such that the at least one of the plurality of electronic components is enabled to adjust its properties based on the trim data set.

The offset may be represented by a two's complement value.

The values for the trim data sets may be stored in a one time programmable memory of the circuit.

The trim data set provided to each electronic circuit may be represented by the first number of bits.

At least one of the programmable electronic components may be one of a programmable resistor comprising a base valued resistance and at least one correction valued resistance in series where the respective correction valued resistances are arranged to be bypassed according to the correction signal, a programmable capacitor comprising a base valued capacitance and at least one correction valued capacitance in parallel where the respective correction valued capacitances are arranged to be connected according to the correction signal, and a programmable transconductance comprising a base valued active component and at least one correction valued active component where the respective correction valued active component are arranged to be activated according to the correction signal.

According to a second aspect, there is provided an electronic device comprising a circuit according to the first aspect.

According to a third aspect, there is provided a method for trimming at least two electronic components of a circuit comprising a plurality of electronic components integrated on a substrate and a trim arrangement arranged to provide trim data to respective electronic components of the plurality of electronic components. The electronic components are programmable such that the electronic components are enabled to be assigned desired properties. The method comprises measuring component values of the at least two electronic components, determining trim values for each of the at least two electronic components as a value for enable trimming the respective component from its measured component value to a desired component value, determining from said trim values a first trim data set, and determining for at least each of the at least two electronic components having a trim value which deviates from a value of the first data set a second trim data set representing an offset from the first trim data set. The first trim data set is represented by a first number of bits and the second trim data set is represented by a second number of bits. The second number is less than the first number. The method further comprises providing a trim data set formed from the first and second trim data sets to at least one of the plurality of electronic components, wherein the at least one of the plurality of electronic components adjusts its properties based on the trim data set.

The method may comprise providing, to at least one of the plurality of electronic components, a trim data set formed from only the first trim data set, wherein the at least one of the plurality of electronic components adjusts its properties based on the trim data set.

The method may comprise representing the offset in the second trim data set by a two's complement value.

Values for the first and second trim data sets may be stored in a one time programmable memory of the circuit.

The method may comprise representing the trim data set provided to each electronic circuit by the first number of bits.

The method may comprise intermediately storing the measured component values or the determined trim values of the at least two electronic components before determining the first trim data set.

Other objectives, features and advantages of the present invention will appear from the following detailed disclosure, from the attached dependent claims as well as from the drawings. Generally, all terms used in the claims are to be interpreted according to their ordinary meaning in the technical field, unless explicitly defined otherwise herein. All references to "a/an/the [element, device, component, means, step, etc]" are to be interpreted openly as referring to at least one instance of said element, device, component, means, step, etc., unless explicitly stated otherwise. The steps of any method disclosed herein do not have to be performed in the exact order disclosed, unless explicitly stated.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings.

FIG. 9 schematically illustrates a circuit according to an embodiment.

FIG. 10 schematically illustrates a circuit according to an embodiment.

FIG. 11 illustrates provision of a trim data set from a first trim data set and an offset trim data set according to an embodiment.

FIG. 12 schematically illustrates a communication device according to an embodiment.

DETAILED DESCRIPTION

Figure 1:
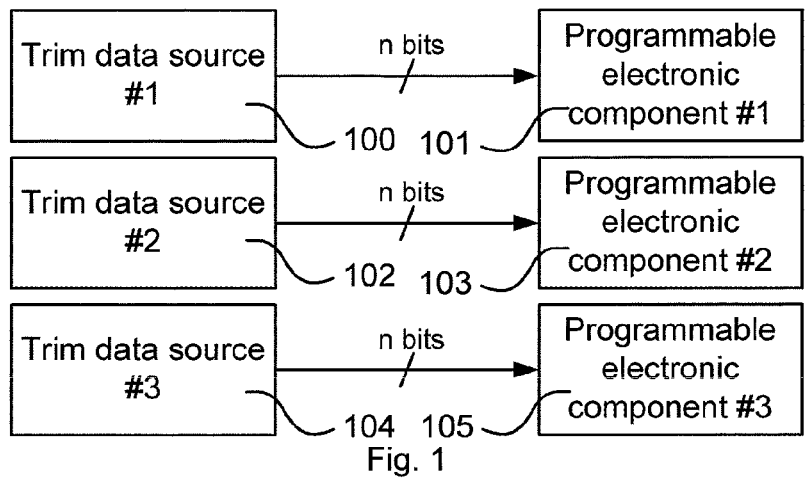
FIG. 1 illustrates an approach for providing individual trim values to programmable electronic components.

FIG. 1 illustrates an approach for providing individual trim values from trim data sources 100, 102, 104 to programmable electronic components 101, 103, 105, respectively. The benefit of such a solution is that each trimmed component, i.e. programmable electronic components 101, 103, 105, is enabled to be controlled by the accurate trim value. On the other hand, since each component 101, 103, 105 needs their own trim source 100, 102, 104, and thus storage of all the trim bits, the solution consumes much circuit area.

Figure 2:
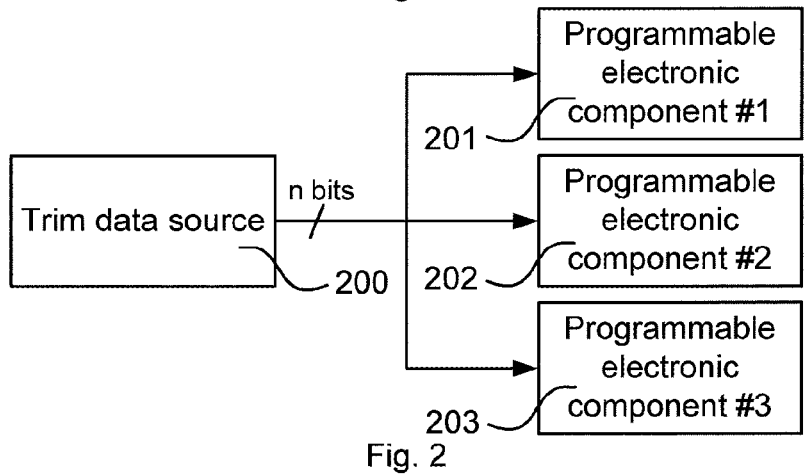
FIG. 2 illustrates an approach for providing a common trim value to programmable electronic components.

FIG. 2 illustrates an approach for providing a common trim value from a trim data source 200 to programmable electronic components 201, 202, 203. The benefit is that only one trim data source 200 is needed, and consumption of circuit area is limited. On the other hand, the trim value may not be correct for all of the components 201, 202, 203 to be trimmed for reasons as discussed above.

Figure 3:
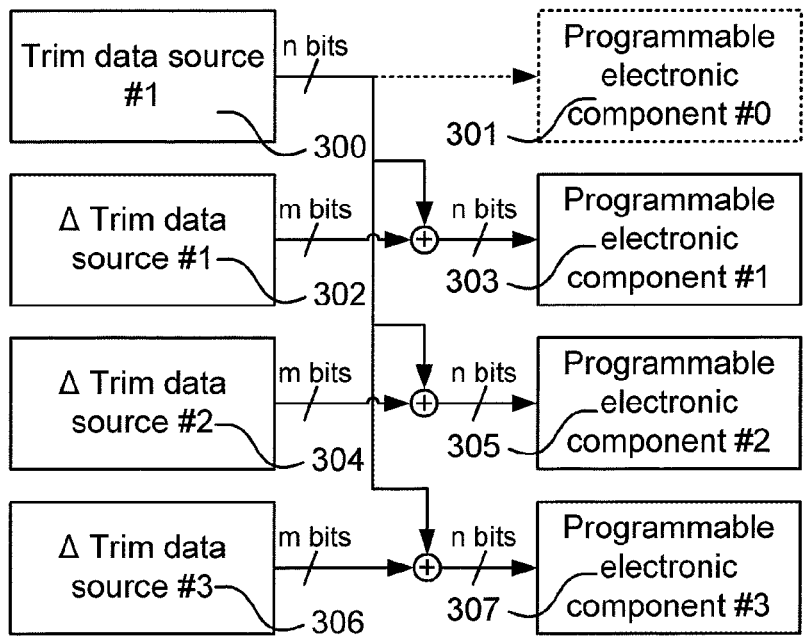
FIG. 3 illustrates an approach according to an embodiment for providing trim values to programmable electronic components.

FIG. 3 illustrates an approach according to an embodiment for providing trim values to programmable electronic components. There is provided a circuit comprising a plurality of electronic components, which are integrated on a substrate, i.e. chip, where the considered electronic components are programmable. There may be other electronic components on the chip that are not programmable, and not being trimmed, and consequently not considered in this disclosure. In this context, the programmable electronic components, which for example may be resistor components, capacitor components, transconductance components, etc., are programmable to obtain desired properties for matching as discussed above. A first trim data source 300 provides a first trim data set. The first trim data set is represented by a first number n of bits. Thus, one trim data item with n bits need to be stored. Further, at least one second trim data source 302, 304, 306 provides a second trim data set. The second trim data set(s) is(are) represented by a second number m of bits, where m<n. Thus, for each second trim data source a data item with m bits further need to be stored. To each programmable electronic component 303, 305, 307, there is provided a trim data set which is based on the first trim data set and the respective second trim data set wherein respective electronic component is enabled to adjust its properties based on the trim data set. The number n of bits is selected such that dynamic of trimming for the circuit is achieved, and the number m of bits is selected such that dynamic between the programmable electronic components 303, 305, 307 is achieved for accurate trimming. The first trim data set and the second trim data set may be added by adders to provide the trim data set for the programmable electronic component. The second trim data set may be represented by a two's complement value such that both positive and negative offset may be represented. Alternatively, the second trim data set may be represented by a positive integer as offset value from the first trim data set. In such cases, the first trim data set may be assigned a low value enough to achieve accurate trim data sets. Alternatively, the second trim data set, represented by a positive integer, may be subtracted from the first trim data set, wherein the first trim data set may be assigned a high value enough to achieve accurate trim data sets. For each of these alternatives, the trim data set is represented by the first number n of bits. A further alternative is that the trim data set is represented by m+n bits (not shown in FIG. 3), where the second trim data set forms the m least significant bits and the first trim data set forms the n most significant bits. Further ways of forming the trim data set based on the first and second trim data sets are equally feasible.

For some components, the first trim data set provides the accurate trim value, or provides sufficiently accurate trimming. Thus, a programmable electronic component 301 may be provided with a trim data set based on the first trim data set only, while other programmable electronic components 303, 305, 307 are provided a trim data set as describe above.

Figure 4:
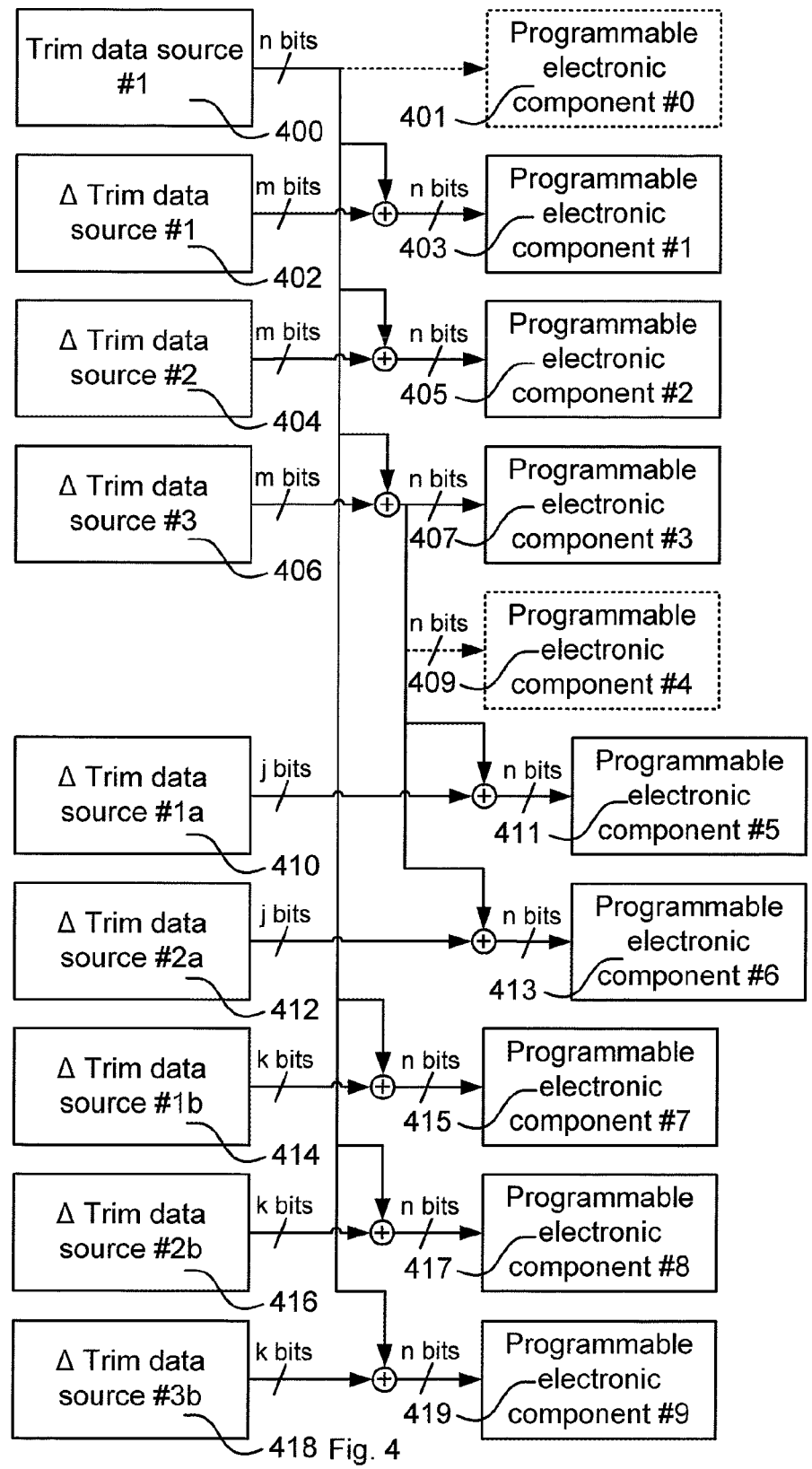
FIG. 4 illustrates an approach according to embodiments for providing trim values to programmable electronic components.

FIG. 4 illustrates an approach according to embodiments for providing trim values to programmable electronic components. FIG. 4 also has the purpose of demonstrating that different approaches may be employed in the same circuit. The particulars about these respective approaches will be demonstrated below with reference to FIGS. 5 and 6. As demonstrated with reference to FIG. 3, a first trim data source 400 provides a first trim data set. The first trim data set is represented by a first number n of bits. Further, at least one second trim data source 402, 404, 406 provides a second trim data set. The second trim data set(s) is(are) represented by a second number m of bits, where m<n. To each programmable electronic component 403, 405, 407, there is provided a trim data set which is based on the first trim data set and the respective second trim data set wherein respective electronic component is enabled to adjust its properties based on the trim data set. The first trim data set and the second trim data set may be added by adders to provide the trim data set for the programmable electronic component, but other ways of forming the trim data sets based on the first and second trim data sets are equally feasible, as also demonstrated with reference to FIG. 3. As also demonstrated with reference to FIG. 3, a programmable electronic component 401 may be provided with a trim data set based on the first trim data set only. Further, FIG. 4 also demonstrates that more than one programmable electronic component 407, 409 may share the same trim data set where found suitable in view of the considerations discussed above.

Some of the programmable electronic components 411, 413 may be provided with a trim data set based on offsets, represented by trim data sets from trim data sources 410, 412, in view of a trim data set formed based on the first and second trim data sets. This may enable these offsets to be represented by even fewer bits j, for example if the design provides for less deviation between e.g. the programmable electronic components 407, 409 and the programmable electronic components 411, 413 such that only little dynamic is required from the trim data sets from the trim data sources 410, 412.

Some of the programmable electronic components 415, 417, 419 may require other dynamic properties of offset represented by trim data sets. This may be both in sense of requirement on higher and lower dynamic range of the trim data sets. For example, the programmable electronic components may be less correlating depending on the design, vicinity and orientation of the components than for example the programmable electronic components 403, 405, 407, 409, wherein trim data sources 414, 416, 418 provide offsets by trim data sets represented by k bits with a larger range, i.e. k>m. The opposite may also apply, i.e. the programmable electronic components 415, 417, 419 may be more correlating depending on the design, vicinity and orientation of the components than for example the programmable electronic components 403, 405, 407, 409 in relation to the component for which the first trim data set is measured for, wherein k<m.

Further ways of forming the trim data set based on the first and second trim data sets are equally feasible, as discussed above, as well as providing trim data set with different number of bits (not shown in FIG. 4) for different programmable electronic components.

Figure 5:
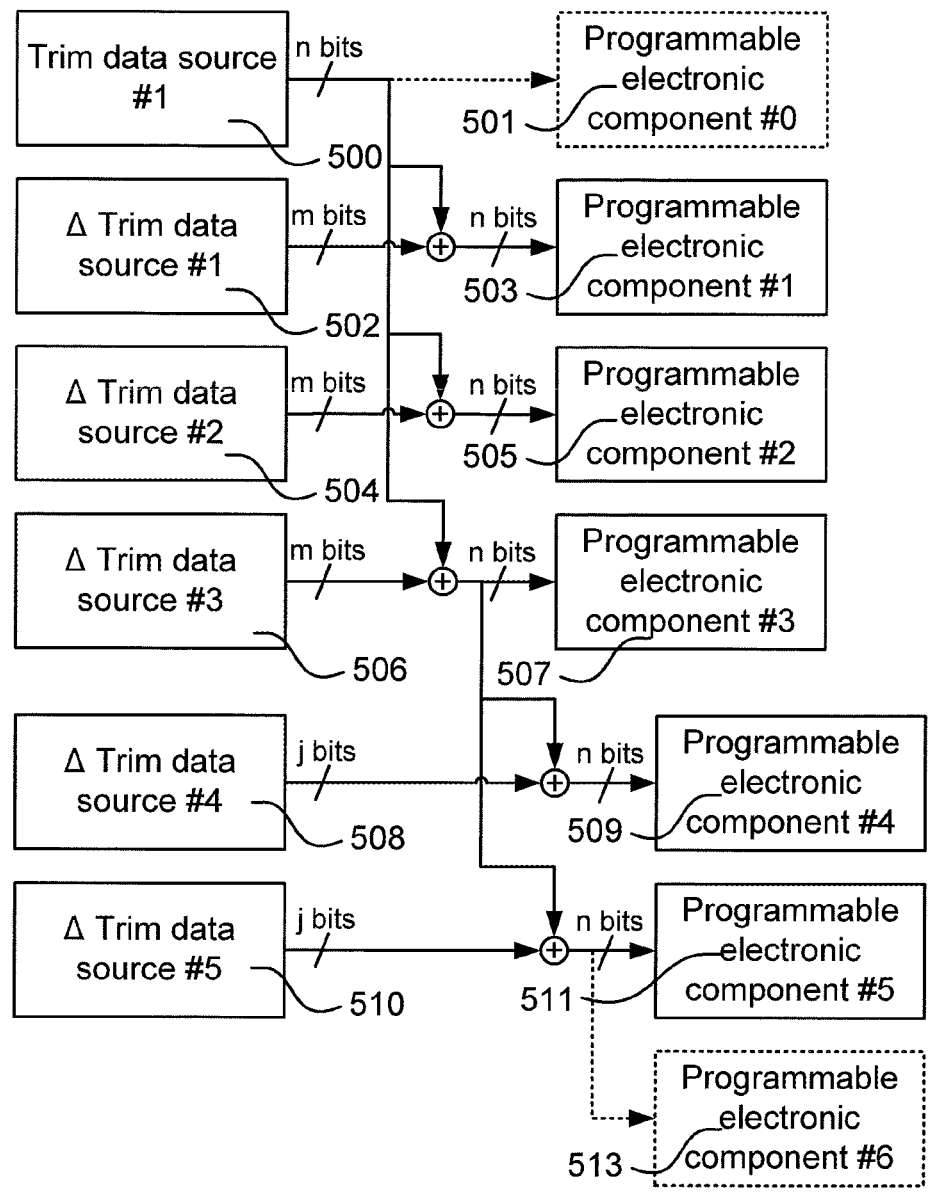
FIG. 5 illustrates an approach according to an embodiment for providing trim values to programmable electronic components.

FIG. 5 illustrates an approach according to an embodiment for providing trim values to programmable electronic components. Similarly as demonstrated with reference to FIG. 3, a first trim data source 500 provides a first trim data set. The first trim data set is represented by a first number n of bits. Further, at least one second trim data source 502, 504, 506 provides a second trim data set. The second trim data set(s) is(are) represented by a second number m of bits, where m<n. To each programmable electronic component 503, 505, 507, there is provided a trim data set which is based on the first trim data set and the respective second trim data set wherein respective electronic component is enabled to adjust its properties based on the trim data set. The first trim data set and the second trim data set may be added by adders to provide the trim data set for the programmable electronic component, but other ways of forming the trim data sets based on the first and second trim data sets are equally feasible, as also demonstrated with reference to FIG. 3. As also demonstrated with reference to FIG. 3, a programmable electronic component 501 may be provided with a trim data set based on the first trim data set only. The embodiment also comprises a trim data set based on offsets, represented by trim data sets from trim data sources 508, 510, in view of a trim data set formed based on the first and second trim data sets. This may enable these offsets to be represented by even fewer bits j, for example if the design provides for less deviation between e.g. the programmable electronic components 509, 511, 513 and the programmable electronic component 507 such that only little dynamic is required from the trim data sets from the trim data sources 508, 510. Further, more than one programmable electronic component 511, 513 may share the same trim data set where found suitable in view of the considerations discussed above.

Figure 6:
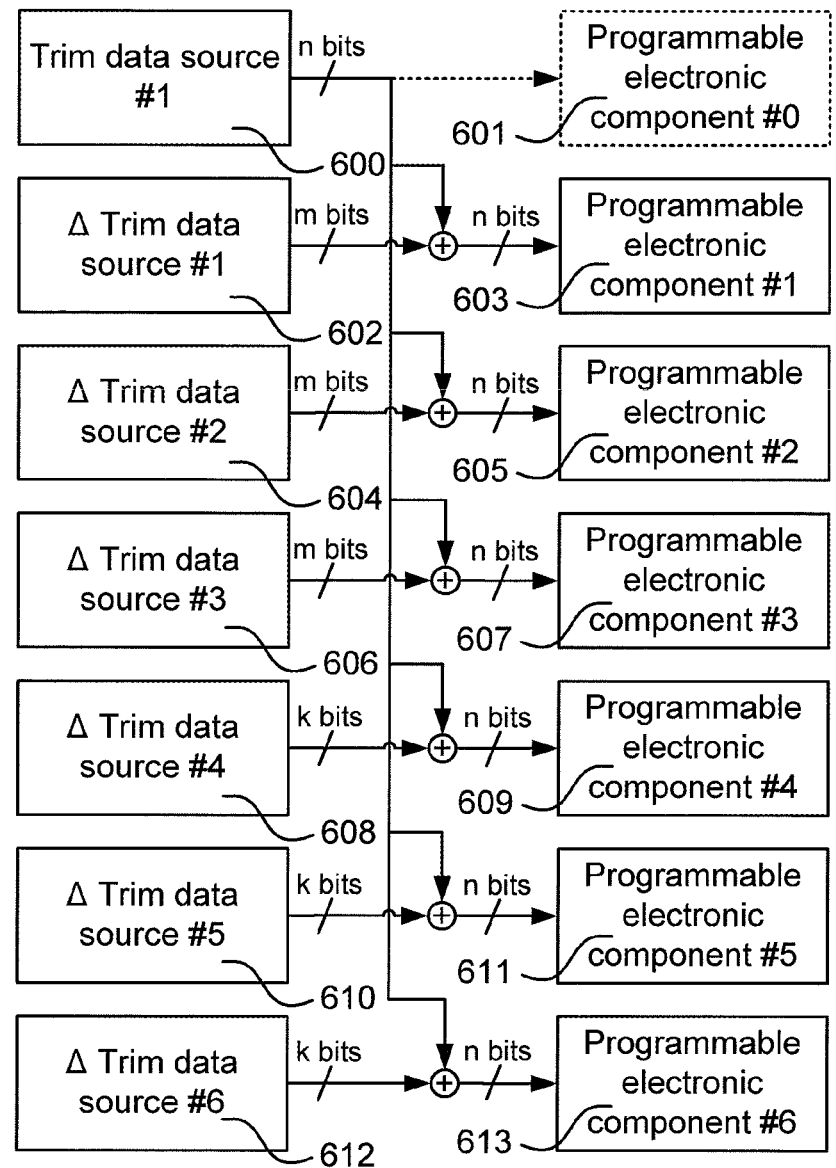
FIG. 6 illustrates an approach according to an embodiment for providing trim values to programmable electronic components.

FIG. 6 illustrates an approach according to an embodiment for providing trim values to programmable electronic components. Similarly as demonstrated with reference to FIG. 3, a first trim data source 600 provides a first trim data set. The first trim data set is represented by a first number n of bits. Further, at least one second trim data source 602, 604, 606 provides a second trim data set. The second trim data set(s) is(are) represented by a second number m of bits, where m<n. To each programmable electronic component 603, 605, 607, there is provided a trim data set which is based on the first trim data set and the respective second trim data set wherein respective electronic component is enabled to adjust its properties based on the trim data set. The first trim data set and the second trim data set may be added by adders to provide the trim data set for the programmable electronic component, but other ways of forming the trim data sets based on the first and second trim data sets are equally feasible, as also demonstrated with reference to FIG. 3. As also demonstrated with reference to FIG. 3, a programmable electronic component 601 may be provided with a trim data set based on the first trim data set only.

Some of the programmable electronic components 609, 611, 613 may require other dynamic properties of offset represented by trim data sets. This may be both in sense of requirement on higher and lower dynamic range of the trim data sets. For example, the programmable electronic components may be less correlating depending on the design, vicinity and orientation of the components than for example the programmable electronic components 603, 605, 607, wherein trim data sources 608, 610, 612 provide offsets by trim data sets represented by k bits with a larger range, i.e. k>m. The opposite may also apply, i.e. the programmable electronic components 609, 611, 613 may be more correlating depending on the design, vicinity and orientation of the components than for example the programmable electronic components 603, 605, 607 in relation to the component for which the first trim data set is measured for, wherein k<m.

Further ways of forming the trim data set based on the first trim data set and one or more of the offset trim data sets demonstrated above are equally feasible, as discussed above, as well as providing trim data sets with different number of bits for different programmable electronic components.

Figure 7:
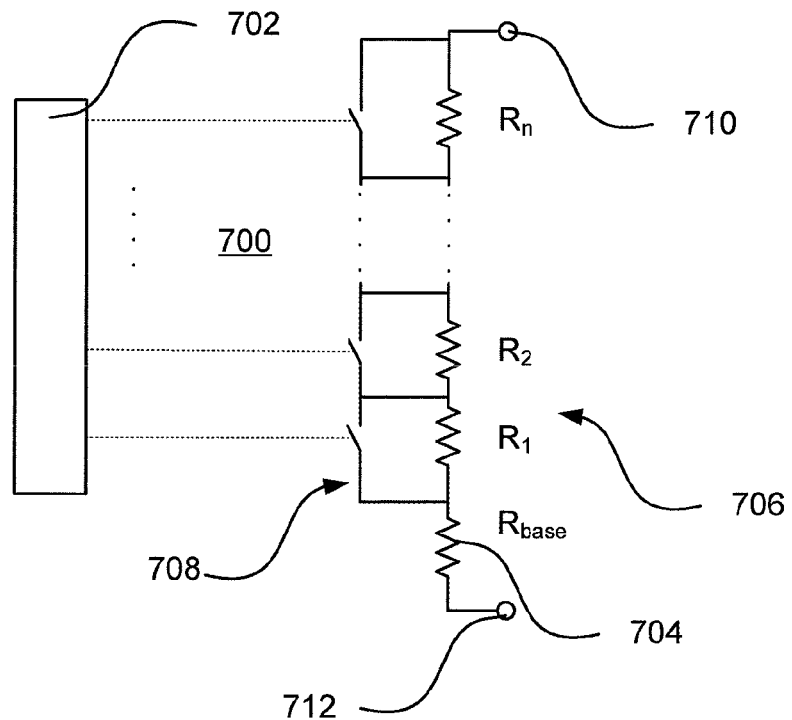
FIG. 7 illustrates an example of a programmable resistor component.

FIG. 7 illustrates an example of a programmable resistor component 700. The programmable resistor component 700 receives a trim data set via an interface 702 towards a trim arrangement of the circuit in which the programmable resistor component 700 is included. The programmable resistor component 700 comprises a base valued resistance 704, which provides a desired resistance, or for example the desired resistance minus approximately an expected process spread for the resistance value, and one or more correction valued resistances 706 connected in series between terminals 710, 710 of the programmable resistor component 700. Each of the correction resistances 706 has a switch 708 connected in parallel to enable selectable bypassing. The trim data set comprises n logic signals which control respective n switches 708. The correction resistances may be valued according to a digital symbol provided by the trim data set. Alternatively, a thermometer code approach may be used. Other assignments of resistance values are equally feasible.

Figure 8:
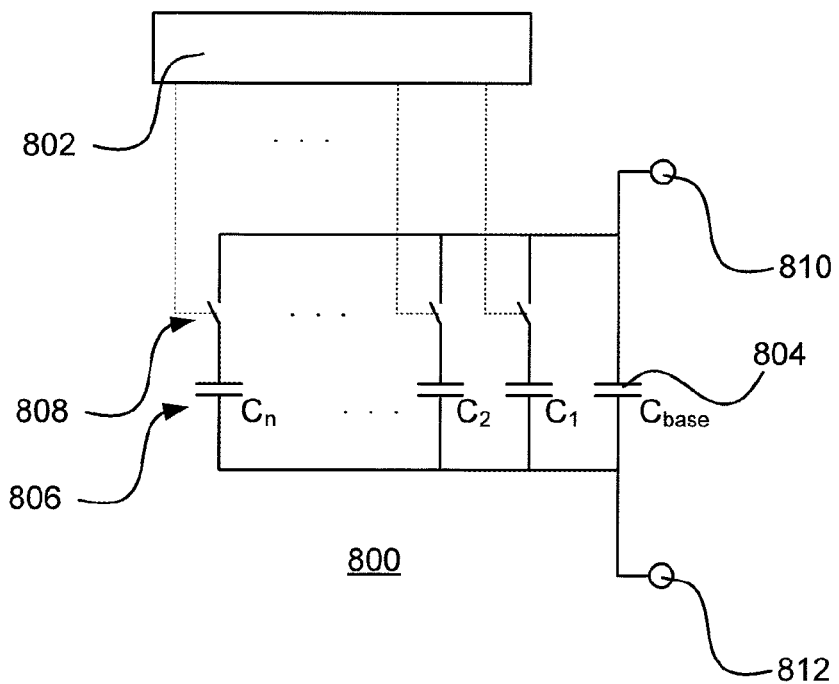
FIG. 8 illustrates an example of a programmable capacitor component.

FIG. 8 illustrates an example of a programmable capacitor component 800. The programmable capacitor component 800 receives a trim data set via an interface 802 towards a trim arrangement of the circuit in which the programmable capacitor component 800 is included. The programmable resistor component 800 comprises a base valued capacitance 804 and one or more correction valued capacitances 806 connected in parallel between terminals 810, 810 of the programmable capacitor component 800. Each of the correction capacitances 806 has a switch 808 connected to enable selectable connecting or disconnecting the correction capacitance. The trim data set comprises n logic signals which control respective n switches 808. The correction capacitances may be valued according to a digital symbol provided by the trim data set. Alternatively, a thermometer code approach may be used. Other assignments of capacitance values are equally feasible.

In a similar way as demonstrated with reference to FIGS. 7 and 8, other types of components are made programmable to be suitable for trimming. For example, a bank of transistors may enable trimming of effective transistor width, or forming a programmable, and thus trimmable, current source. Other configurations of active components are also feasible.

FIG. 9 schematically illustrates a circuit 900 according to an embodiment. A component implemented on silicon may not have exactly the value it was implemented for. Instead, the component value may vary around the nominal value. To achieve higher accuracy, the component may be implemented as a programmable component, where the programmable component range preferably is large enough to cover the desired value. The component is preferably measured and a trim setting which gives the desired component value is chosen. The trim bits may be stored in a One-Time Programmable (OTP) memory 902. The circuit comprises a set of trim data sources 904 comprising first a trim data source and one or more offset trim data sources. They form, together with a distribution network, as demonstrated with reference to any one of FIGS. 3 to 6, a trim data set for respective programmable electronic component 906. The trim settings, at least the offset settings, may be stored as two's complement numbers allowing for negative settings relative to a default setting. If the adders work statically without clocking as soon as there is a supply voltage for the circuit, the trimming is effective directly at start-up. Use of an adder provides less circuit area consumption compared to the OTP trim bits, wherein there is a net saving in circuit area. The actual number of trim bits after the adder may be the same as for the reference component.

FIG. 10 schematically illustrates a circuit 1000 according to an embodiment. The circuit 1000 is similar to the one demonstrated with reference to FIG. 9, but instead of having a memory located on the same chip, the circuit may receive trim data from a remote chip 1002. The circuit comprises a set of trim data sources 1004 comprising first a trim data source and one or more offset trim data sources. They form, together with a distribution network, as demonstrated with reference to any one of FIGS. 3 to 6, a trim data set for respective programmable electronic component 1006.

FIG. 11 illustrates provision of a trim data set from a first trim data set and an offset trim data set according to an embodiment. An adder 1100 comprises a first input for a number of bits (corresponding to the first trim data set as demonstrated above) and a second input for the offset trim data set, which has fewer bits and is represented by a two's complement, as can be seen from the most significant bit of the offset trim data set connected to higher value bits of the input of the adder 1100, wherein the different number of bits in the representations of the first trim data set and the offset trim data set may be handled, i.e. the most significant bit in the offset trim data set representation is a sign bit. The output is provided to an interface 1102 which corresponds to interfaces 702, 802 demonstrated with reference to FIGS. 7 and 8.

FIG. 12 is a block diagram schematically illustrating a communication device 1200 according to an embodiment. The communication device 1200 is presented as an example of an electronic device which may benefit from the approach of trimming components as demonstrated above. From the example, it is however readily understood how also other electronic devices may benefit from the above demonstrated approach.

The communication device 1200 comprises a receiver, transmitter or transceiver arrangement 1202 which comprises one or more circuits 1210 comprising circuitry as those demonstrated above, e.g. one or more filters, mixers, amplifiers, etc. where trimming is desired. The one or more circuits 1210 also comprises the trim arrangement as described with reference to any one of FIGS. 3 to 11 above. The receiver, transmitter or transceiver arrangement 1202 may be connected to an antenna 1204 through its antenna port. The communication device 1200 may also comprise other circuits 1206, such as interface towards a user and/or other circuitry or machines, memory, processor, etc. The communication device 1200 may be a smartphone or cellphone, a communication card or device in or for a computer, an embedded communication device in a machine, or the like. The communication device 1200 may be adapted for cellular communication, point-to-point communication, or for communication in a wireless or wired network.

The antenna port described above need not necessarily by connected to an antenna, but can equally be connected to a wired line which conveys radio frequency signals. Thus, the communication device 1200 described with reference to FIG. 12 need not comprise the antenna 1204 wherein the communication device is instead connected to such a wired line conveying radio frequency signals.

The receiver or transceiver arrangement 1202 may comprise a controller 1208 for controlling the operation of the receiver, transmitter or transceiver arrangement 1202. The controller 1208 may be arranged to perform the operations of calibration measurements as demonstrated above, e.g. control, computation, lookup table access, etc. for populating trim data sources.

Figure 13:
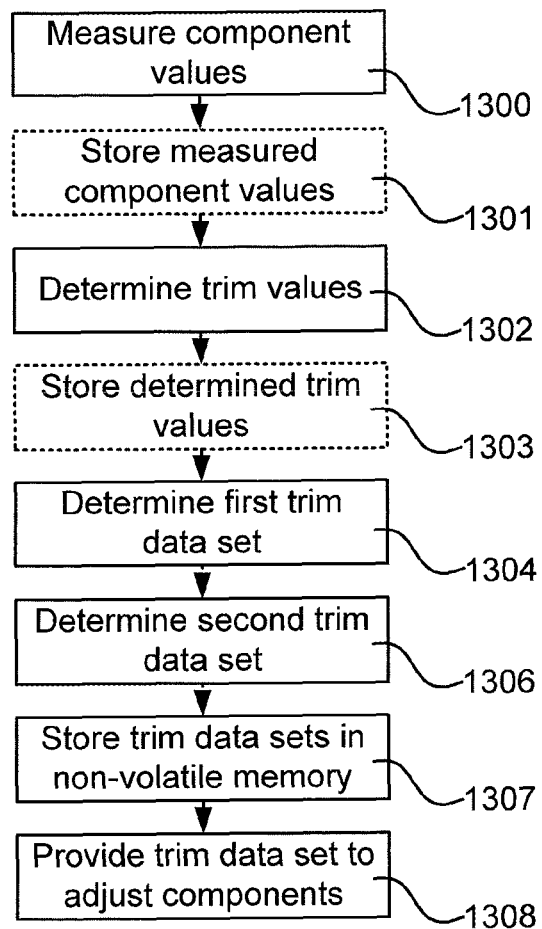
FIG. 13 is a flow chart illustrating methods according to embodiments.

FIG. 13 is a flow chart illustrating methods according to embodiments. The methods are suitable for trimming using the circuit described with its different embodiments above.

The method is suitable for trimming at least two electronic components of a circuit comprising a plurality of electronic components integrated on a substrate and a trim arrangement arranged to provide trim data to respective electronic components of the plurality of electronic components. As demonstrated above, the electronic components are programmable such that the electronic components are enabled to be assigned desired properties. Component values of the at least two electronic components are measured 1300. The measured component values of the electronic components may be intermediately stored 1301, e.g. in a volatile memory for enabling reading of the measured component values for the processing described hereafter. Based on the measured component values and respective desired component value, trim values for each of the at least two electronic components are determined 1302 as a value for enable trimming the respective component from its measured component value to the desired component value. The determined trim values of the electronic components may be intermediately stored 1303, e.g. in a volatile memory for enabling reading of the determined trim values for the processing described hereafter. From said trim values a first trim data set is determined 1304, and for at least each of the at least two electronic components having a trim value which deviates from a value of the first data set a second trim data set is determined 1306. The second data set represents, respectively, an offset from the first trim data set. As demonstrated above, the first trim data set is represented by a first number of bits and the second trim data set is represented by a second number of bits, wherein the second number is less than the first number. The offset in the second trim data set may be represented by a two's complement value. Values for the first and second trim data sets may be stored 1307 in non-volatile memory, e.g. a one-time programmable memory of the circuit. For trimming the component values to reach their desired component values, there is provided 1308 a trim data set formed from the first and second trim data sets, i.e. the added values of the first and second trim data sets, to at least one of the plurality of electronic components, wherein the respective electronic components are able to adjust its properties based on the trim data set. Thus, the respective provided trim data set may represent a value corresponding to the determined trim values from step 1302, but requiring less stored bits than a solution as demonstrated with reference to FIG. 1. Here, the first trim data set may be chosen to a value that fits directly to one or more of the electronic components, wherein the trim data set for that or those electronic components may be formed from only the first trim data set.

Optionally, the method comprises determining and providing a third trim data set representing an offset from the first trim data set in a similar way as demonstrated above, and providing, to at least some of the plurality of electronic components, a trim data set formed from the first and third trim data sets. The third trim data set is represented by a third number of bits, wherein the third number is less than the first number. The at least one of the plurality of electronic components adjusts its properties based on the trim data set.

Optionally or additionally, the method comprises determining and providing a fourth trim data set representing an offset from the trim data set formed from the first and second trim data sets in a similar way as demonstrated above, and providing, to at least one of the plurality of electronic components, a trim data set formed from fourth trim data set and the trim data set formed from the first and second trim data sets. The fourth trim data set is represented by a fourth number of bits, wherein the fourth number is less than the first number. The at least one of the plurality of electronic components adjusts its properties based on the trim data set.

In a similar way, one or more levels of offset data sets and their respective use in providing a trim data set for respective electronic components may be employed.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. A circuit comprising a plurality of electronic components integrated on a substrate, and a trim arrangement arranged to provide trim data to a respective electronic component of the plurality of electronic components, wherein the electronic components are programmable such that the electronic components are enabled to be assigned desired properties, and wherein the trim arrangement comprises a first trim data source providing a first trim data set represented by a first number of bits;

at least one second trim data source providing a second trim data set representing an offset from the first trim data set, wherein the second trim data set is represented by a second number of bits, and the second number is less than the first number such that at least one of the plurality of electronic components is provided with a trim data set formed from the first and second trim data sets such that the at least one of the plurality of electronic components is enabled to adjust its properties based on the trim data set.

2. The circuit of claim 1, wherein at least one of the plurality of electronic components is provided with a trim data set formed from only the first trim data set such that the at least one of the plurality of electronic components is enabled to adjust its properties based on the trim data set.

3. The circuit of claim 1, wherein the trim arrangement comprises:

at least one third trim data source providing a third trim data set representing an offset from the first trim data set, wherein the third trim data set is represented by a third number of bits, and the third number is less than the first number such that at least one of the plurality of electronic components is provided with a trim data set formed from the first and third trim data sets such that the at least one of the plurality of electronic components is enabled to adjust its properties based on the trim data set.

4. The circuit of claim 1, wherein the trim arrangement comprises at least one fourth trim data source providing a fourth trim data set representing an offset from the trim data set formed from the first and second trim data sets, wherein the fourth trim data set is represented by a fourth number of bits, and the fourth number is less than the first number such that at least one of the plurality of electronic components is provided with a trim data set formed from fourth trim data set and the trim data set formed from the first and second trim data sets such that the at least one of the plurality of electronic components is enabled to adjust its properties based on the trim data set.

5. The circuit of claim 1, wherein the offset is represented by a two's complement value.

6. The circuit of claim 1, wherein values for the trim data sets are stored in a one-time programmable memory of the circuit.

7. The circuit of claim 1, wherein the trim data set provided to each electronic circuit is represented by the first number of bits.

8. The circuit of claim 1, wherein at least one of the programmable electronic components is one of:

a programmable resistor comprising a base valued resistance and at least one correction valued resistance in series where the respective correction valued resistances are arranged to be bypassed according to the correction signal;

a programmable capacitor comprising a base valued capacitance and at least one correction valued capacitance in parallel where the respective correction valued capacitances are arranged to be connected according to the correction signal; and a programmable transconductance comprising a base valued active component and at least one correction valued active component where the respective correction valued active component are arranged to be activated according to the correction signal.

9. An electronic device comprising a circuit of claim 1.

10. A method for trimming at least two electronic components of a circuit comprising a plurality of electronic components integrated on a substrate and a trim arrangement arranged to provide trim data to respective electronic components of the plurality of electronic components, wherein the electronic components are programmable such that the electronic components are enabled to be assigned desired properties, and the method comprises:

measuring component values of the at least two electronic components;

determining trim values for each of the at least two electronic components as a value for enable trimming the respective component from its measured component value to a desired component value;

determining from said trim values a first trim data set, and determining for at least each of the at least two electronic components having a trim value which deviates from a value of the first data set a second trim data set representing an offset from the first trim data set, wherein the first trim data set is represented by a first number of bits and the second trim data set is represented by a second number of bits, and the second number is less than the first number; and providing a trim data set formed from the first and second trim data sets to at least one of the plurality of electronic components, wherein the at least one of the plurality of electronic components adjusts its properties based on the trim data set.

11. The method of claim 10, comprising providing, to at least one of the plurality of electronic components, a trim data set formed from only the first trim data set, wherein the at least one of the plurality of electronic components adjusts its properties based on the trim data set.

12. The method of claim 10, comprising representing the offset in the second trim data set by a two's complement value.

13. The method of claim 10, wherein values for the first and second trim data sets are stored in a one-time programmable memory of the circuit.

14. The method of claim 10, comprising representing the trim data set provided to each electronic circuit by the first number of bits.

15. The method of claim 10, comprising intermediately storing the measured component values or the determined trim values of the at least two electronic components before determining the first trim data set.

* * * * *

UNITED STATES PATENT AND TRADEMARK OFFICE
CERTIFICATE OF CORRECTION

PATENT NO. : 9,324,704 B2  Page 1 of 1
APPLICATION NO. : 14/600156
DATED : April 26, 2016
INVENTOR(S) : Klingström It is certified that error appears in the above-identified patent and that said Letters Patent is hereby corrected as shown below:

In the specification,

In Column 7, Lines 63-64, delete "terminals 710, 710" and insert -- terminals 710, 712 --, therefor.

In Column 8, Line 9, delete "resistor" and insert -- capacitor --, therefor.

In Column 8, Line 12, delete "terminals 810, 810" and insert -- terminals 810, 812 --, therefor.

Signed and Sealed this
Twelfth Day of July, 2016

Michelle K. Lee
*Director of the United States Patent and Trademark Office*